(12) United States Patent
Aleksandrov et al.

(10) Patent No.: US 10,717,150 B2
(45) Date of Patent: Jul. 21, 2020

(54) METHOD FOR PRODUCING ARTICLES FROM IRIDIUM METAL

(71) Applicants: OOO NPO "Metally Urala", Ekaterinburg (RU); IP GERASIMOV Aleksej Leonidovich, Ekaterinburg (RU)

(72) Inventors: Evgenij P. Aleksandrov, Ekaterinburg (RU); Aleksandr S. Kazakov, Ekaterinburg (RU)

(73) Assignees: OOO NPO "Metally Urala", Ekaterinburg (RU); IP GERASIMOV Aleksej Lenidovich, Ekaterinburg (RU)

( * ) Notice: Subject to any disclaimer, the term of this patent is extended or adjusted under 35 U.S.C. 154(b) by 302 days.

(21) Appl. No.: 16/002,583

(22) Filed: Jun. 7, 2018

(65) Prior Publication Data

US 2018/0361500 A1    Dec. 20, 2018

Related U.S. Application Data

(63) Continuation of application No. PCT/RU2016/000849, filed on Dec. 6, 2016.

(30) Foreign Application Priority Data

Dec. 9, 2015    (RU) ................ 2015152955

(51) Int. Cl.

| B23K 15/00 | (2006.01) |
|---|---|
| B82Y 40/00 | (2011.01) |
| B22F 3/093 | (2006.01) |
| C22C 5/04 | (2006.01) |
| B22F 3/04 | (2006.01) |
| B22F 5/12 | (2006.01) |
| B33Y 10/00 | (2015.01) |
| B33Y 70/00 | (2020.01) |
| B22F 1/00 | (2006.01) |
| C30B 35/00 | (2006.01) |
| B23K 103/08 | (2006.01) |

(52) U.S. Cl.
CPC ........ B23K 15/0086 (2013.01); B22F 1/0018 (2013.01); B22F 3/04 (2013.01); B22F 3/093 (2013.01); B22F 5/12 (2013.01); B23K 15/0026 (2013.01); B23K 15/0093 (2013.01); B33Y 10/00 (2014.12); B33Y 70/00 (2014.12); B82Y 40/00 (2013.01); C22C 5/04 (2013.01); B22F 2301/25 (2013.01); B22F 2304/056 (2013.01); B22F 2998/10 (2013.01); B22F 2999/00 (2013.01); B23K 2103/08 (2018.08); C30B 35/002 (2013.01)

(58) Field of Classification Search
CPC ........... B23K 15/0086; B23K 15/0026; B23K 15/0093; B23K 2103/08; B33Y 10/00; B22F 1/0018; B22F 3/04; B22F 3/093; B22F 5/12; B22F 2301/25; B22F 2304/056; B22F 2998/10; B22F 2999/00; C22C 5/04; C30B 35/002
USPC ........................................ 219/76.1
See application file for complete search history.

(56) References Cited

U.S. PATENT DOCUMENTS

| 3,518,336 A | 6/1970 | Payne | |
|---|---|---|---|
| 4,917,968 A | 4/1990 | Tuffias et al. | |
| 5,623,725 A * | 4/1997 | Disam | B22F 9/30 419/19 |
| 5,877,437 A * | 3/1999 | Oltrogge | B22F 1/0003 75/228 |
| 2015/0320895 A1 * | 11/2015 | Sun | A61K 51/025 600/8 |
| 2017/0021417 A1 * | 1/2017 | Martin | B33Y 10/00 |
| 2017/0084357 A1 * | 3/2017 | Shilton | G21G 4/06 |
| 2018/0361500 A1 * | 12/2018 | Aleksandrov | B33Y 70/00 |
| 2019/0295736 A1 * | 9/2019 | Vose | G21G 4/06 |

FOREIGN PATENT DOCUMENTS

| DE | 19824689 | * | 10/1999 |
|---|---|---|---|
| JP | 4-56706 | | 2/1992 |
| JP | 04056706 A | * | 2/1992 |
| RU | 95166 U1 | | 6/2010 |
| RU | 2521184 C1 | | 6/2014 |
| SU | 366930 | * | 7/1971 |
| SU | 366930 | | 1/1973 |

OTHER PUBLICATIONS

International Search Report from International Application No. PCT/RU2016/000849, filed Dec. 6, 2016, dated Apr. 27, 2017.
Timofeev et al, Basics of metallurgy and iridium production technology, Ekaterinburg, 1996, pp. 105-109.

* cited by examiner

Primary Examiner — Jimmy Chou
(74) Attorney, Agent, or Firm — Patentbar International, P.C.

(57) ABSTRACT

A method for producing articles from iridium metal nano-powder. This invention relates to the sphere of powder metallurgy and may find application in the production of different articles from iridium. Technically, the object of the invention is development of a new technology. To this aim a method is proposed for the production of articles from iridium based on use of chemically pure metal of not less than 99.99 purity, produced by electron-beam remelting, characterized in that the required material is turned to nanopowder of less than 100 nm dispersity from which seamless articles of various configuration are molded by their compacting at room temperature followed by baking, with the resulting isotropic structure featuring 100-300 nm grain size and strength characteristics being improved by 200-300%.

1 Claim, No Drawings

METHOD FOR PRODUCING ARTICLES FROM IRIDIUM METAL

RELATED APPLICATIONS

This Application is a Continuation application of International Application PCT/RU2016/000849, filed on Dec. 6, 2016, which in turn claims priority to Russian Patent Applications RU 2015152955, filed Dec. 9, 2015, both of which are incorporated herein by reference in their entirety.

FIELD OF THE INVENTION

A method for the production of articles from iridium metal nanopowder. This invention relates to the sphere of powder metallurgy and may find application in the production of different articles from iridium.

BACKGROUND OF THE INVENTION

Iridium is a refractory platinum-group metal. The combination of such properties as high melting point and the highest among metals unreactiveness make this metal an indispensable structural materials for operation under conditions of elevated temperatures (up to 2200° C.) and aggressive environments. This is the only metal from which special application articles are manufactured, such as:

crucibles for growing large oxide monocrystals used in microelectronics and laser technology;

rolled stock for the manufacture of small-size nuclear reactor pressure vessels and containers for plutonium dioxide-based thermoelectric generators for interplanetary space flights;

disks for the manufacture of radioisotope sources for use in non-destructive testing instruments and in oncological diseases treatment;

wire for the manufacture of thermocouples for not less than 2200° C. measured temperatures range;

electrodes for motor vehicle spark plugs ensuring over 250 thousand kilometers of vehicle run.

The worldwide demand for iridium articles in 2014 grew four times to reach 10.5 tons, with a 2.5-times increase in the price for iridium. Steady industrial demand for iridium products is a factor preserving stability of prices at the present time as well.

The major problem in the manufacture of products from iridium is high sensitivity of this metal processing and service characteristics to presence of most insignificant quantities of impurity elements, which appear to be the principal cause of brittle failure of iridium. According to the traditional technology of manufacture of iridium articles, the blanks used in the production of iridium rolled stock present iridium monocrystals with impurities content not exceeding 0.003% obtained in the process of preliminary multi-stage energy-consuming fire refining with the use of electron-beam remelting (EBR) under vacuum. The industrial technology of production of this metal is available to a limited number of manufacturers, among them such companies as: Johnson Matthey PLC (UK), W.C. Heraeus GmbH (Germany), the Oak Ridge National Laboratory (USA), Engelhard-CLAL Corporation (USA), OAO Ekaterinburg Non-Ferrous Metals Treatment Plant and ZAO URALINTEKH (Russia).

High-purity iridium metal nanopowder (MINP) is designed for creation of new structural materials with a set of targeted physical-chemical and application properties, offering an opportunity for development of principally new efficient processes for the manufacture of articles with improved service characteristics.

MINP was generated as a result of an original combination of hydrometallurgical, electrochemical and fire refining processes; it presents black particles of 99.990% chemically pure metal 20-70 nanometers in size, with surface area within 3-7 $m^2/g$ and powder bulk density of 0.4-0.9 $g/cm^2$. The metal is thermally stable at up to 200° C. in air, and non-pyrophoric.

As compared with the industrial iridium powders of home and foreign manufacture, the proposed MINP exceeds them by an order of magnitude in chemical purity, 5 to 10 times in powder bulk density characterizing unit mass consumption per unit volume, and 200 to 400 times in surface area characterizing catalytic activity.

Processes under development in the USA include deposition of a coat of iridium on articles operating under rigorous service conditions, on rocket nozzles in particular. A refractory corrosion-resistant coating of the working surfaces of a combustion chamber and a rocket-thrust-chamber nozzle will allow temperature rise from 1300° C. (current engines) to 2000-2100° C., resulting in increased fuel efficiency and useful load (see www.fazwest.com).

To this aim, the chemical vapor deposition method (CVD) with the use of complex organic iridium compounds was earlier selected; however the process of production of these metalorganic compounds is expensive since it requires special synthesis conditions, and the CVD process proper with the use of these compounds is found hard to localize in the target zone. For this reason, 70-80% of iridium is assimilated by chamber walls, and only 20-30% being deposited on the target surface.

There is a known technology of manufacture of iridium crucibles (see Timofeev N. I., Yeramakov A. V., Dmitriev V. A., Panfilov P. E. Osnovy metallurgii i tekhnologii proizvodstva izdelii iz iridiya (*Basic metallurgy and process for production of articles from iridium*). Ekaterinburg: UB RAS, 1996.—prototype) comprising the following operations:

production of metal compact by pressing initial powder, GOST 12338-81;

induction oxidizing melting in periclase crucible;

autoclaving;

ingot swaging;

electron-beam vacuum melting in horizontal mold;

electron-beam non-crucible zone melting, monocrystal growing;

swaging (2000-1100° C.), production of sheet bar;

boiling in chloronitric acid;

rolling (1000-800° C.), production of plate;

boiling in chloronitric acid;

manufacture of crucible shell ring (600-800° C.);

boiling in hydrochloric acid;

shell ring welding and its welding to bottom;

crucible annealing at 1100° C.;

polishing.

Metal yield in a finished article is 60-65% with up to 1.3% irrecoverable loss.

Drawbacks: great number of operations, low finished product yield and high production cost.

SUMMARY OF THE INVENTION

Technically, the object of the invention is development of a new technology that will ensure:

exclusion of expensive electron-beam melting and iridium monocrystal growing equipment;

1.5 times increase in metal yield in a finished article;

production cycle reduction several times;
significant reduction of irrecoverable losses of iridium;
1.5 to 2 times reduction of articles production cost;
conjugation with the traditional technology at any stage.

The technical result is obtained at the expense of use of iridium in the form of high-purity nanodisperse powder in the form of articles finding application in different branches of industry and medicine and connected with its amazing physical-chemical and physical-mechanical properties.

To this aim a method is proposed for the production of articles from iridium based on use of iridium metal powder of not less than 99.99 wt. % purity obtained through an original combination of hydrometallurgical, electrochemical and fire refining processes, characterized in that the ingoing material is turned to nanopowder of less than 100 nm dispersity from which a blank of the future article is obtained by compacting at room temperature followed by baking.

Use of high-purity nanopowder improves the consumer properties of the articles due to absence of interstitial impurities and welded seams leading to the article failure in operation.

INDUSTRIAL APPLICABILITY

Thus it may be added that application of iridium will be related to processes where its use is indispensable (as in oxide crystals growing), or to articles characterized by minimum consumption of materials but operating under extremely rigorous conditions:

in $Ir^{192}$ gamma-ray sources, in metal segments of ignition plugs of internal combustion engines, in high-temperature thermocouples and corrosion-resistant anode coatings;

creation of noble metal composites used in medicine (in cardio- and neurostimulators), also in industrial nickel and titanium-based composites used primarily in aircraft building which is due to the positive effect of even small additions of this metal on the processing and service properties of articles manufactured from these materials.

Application of MINP provides an opportunity to produce seamless pipe billets that may further be hot rolled to the required dimensions of a rocket liner.

DESCRIPTION OF THE EMBODIMENTS

Examples of articles produced from iridium:

A method for producing articles from iridium: container material (crucible) for obtaining optical monocrystals used in laser technology and microelectronics.

High-purity iridium nanopowder is loaded in an elastic sealed shell, compacted by vibration during 30 min at 50 Hz vibration frequency, and, by isostatic compacting at 150-350 MPa at room temperature, an article is molded and subsequently baked at 1000-1350° C.

A method for the production of article: iridium wire.

High-purity iridium nanopowder is loaded in an elastic sealed shell, compacted by vibration during 30 min at 50 Hz vibration frequency, and, by isostatic compacting at 150-350 MPa at room temperature, a blank in the form of a cylindrical bar is molded and subsequently baked at 1000-1350° C. The bar is further used for making iridium wire of the required diameter.

What is claimed is:

1. A method for producing seamless articles from chemically pure iridium of no less than 99.99 wt. % purity and of an isotropic structure having a grain size between 100-300 nm, the method comprising compacting a disperse powder of the iridium of no less than 100 nm under pressure between 150-350 MPa at a room temperature followed by baking at a temperature between 1000-1350° C.

* * * * *